United States Patent [19]
Kinoshita

[11] Patent Number: 5,869,852
[45] Date of Patent: Feb. 9, 1999

[54] SEMICONDUCTOR INTEGRATED CIRCUIT AND SEMICONDUCTOR INTEGRATED CIRCUIT HAVING LAYOUT DESIGNED BY CELL BASE SYSTEM

[75] Inventor: Satoru Kinoshita, Tokyo, Japan

[73] Assignee: Mitsubishi Denki Kabushiki Kaisha, Tokyo, Japan

[21] Appl. No.: 941,210

[22] Filed: Sep. 30, 1997

[30] Foreign Application Priority Data

Apr. 8, 1997 [JP] Japan ................................. 9-089808

[51] Int. Cl.⁶ ................................................. H01L 27/118
[52] U.S. Cl. ........................... 257/207; 257/210; 257/532
[58] Field of Search ................................... 257/202, 207, 257/211, 210, 532

[56] References Cited

U.S. PATENT DOCUMENTS

| | | | |
|---|---|---|---|
| 4,716,452 | 12/1987 | Kondoh et al. | 257/211 |
| 4,785,202 | 11/1988 | Toyoda | 257/532 |
| 5,148,263 | 9/1992 | Hamai | 257/211 |
| 5,309,015 | 5/1994 | Kuwata et al. | 257/207 |
| 5,598,029 | 1/1997 | Suzuki | 257/532 |

FOREIGN PATENT DOCUMENTS

| | | | |
|---|---|---|---|
| 62-114238 | 5/1987 | Japan | 257/532 |
| 63-246843 | 10/1988 | Japan | 257/210 |
| 3259549 | 11/1991 | Japan . | |
| 5-082725 | 4/1993 | Japan | 257/532 |
| 9700763 | 3/1997 | WIPO . | |

*Primary Examiner*—David B. Hardy
*Attorney, Agent, or Firm*—Leydig Voit & Mayer

[57] ABSTRACT

A semiconductor integrated circuit including a second electrode on a dielectric film opposite a first electrode and constituting a capacitor. Grounding wiring is connected to the first electrode and power supply wiring is connected to the second electrode so the capacitor can be directly connected to the power supply and the ground in a semiconductor integrated circuit, significantly attenuating noise.

12 Claims, 20 Drawing Sheets

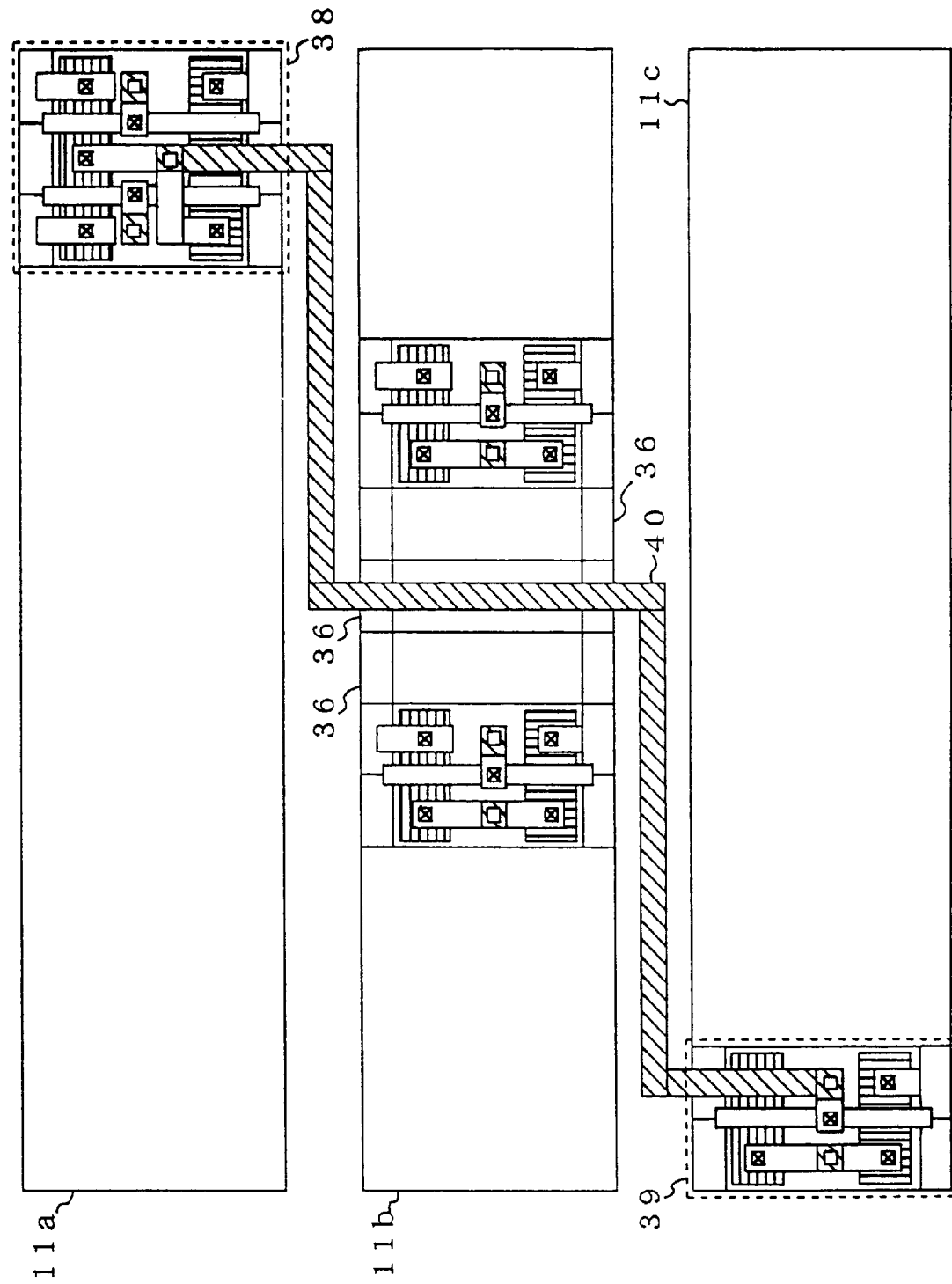

SEMICONDUCTOR INTEGRATED CIRCUIT AND SEMICONDUCTOR INTEGRATED CIRCUIT HAVING LAYOUT DESIGNED BY CELL BASE SYSTEM

BACKGROUND OF THE INVENTION

1. Field of the Invention

The present invention relates to a semiconductor integrated circuit incorporating bypass capacitors connecting power supply wiring to grounding wiring and a semiconductor integrated circuit having a layout designed by the cell base system.

2. Description of the Prior Art

FIG. 33 is a conceptual view showing the layout pattern of a conventional IC including digital portion and an analog portion, FIG. 34 is a sectional view showing an IC package mounted with a conventional IC chip, and FIG. 35 is a perspective view showing a conventional IC package. In respect of FIG. 33, numeral 1 designates an IC chip formed on a silicon substrate, numeral 2 designates a digital portion formed on the IC chip 1 and numeral 3 designates an analog portion formed on the IC chip 1. Numeral 4 designates power supply wiring for the digital portion, numeral 5 designates grounding wiring for the digital portion, numeral 6 designates power supply wiring for the analog portion and numeral 7 designates grounding wiring for the analog portion.

In respect of FIG. 34, numeral 8 designates a package, numeral 9 designates a lead of the IC chip and numeral 10 designates a wire for connecting the lead 9 and the IC chip 1.

An explanation will be given of the operation as follows.

Generally, a semiconductor integrated circuit (hereinafter, referred to as IC) is functionally classified as a digital IC or an analog IC. The digital IC is an IC carrying a logical circuit operating with values of "1" and "0", (logical circuit), a memory, a microcomputer or the like. Meanwhile, the analog IC is an IC dealing with not "1" and "0", but with continuously changing signals such as the intensity of sound or temperature which is often used in a circuit for amplifying current. In using the digital IC and the analog IC in combination, noise generated from the digital IC influences the operation of the analog IC. Normally such a problem is dealt with by attenuating the noise from the digital IC by attaching a capacitor between a power supply terminal and a grounding terminal of the digital IC. The capacitor is referred to as a bypass capacitor.

In recent years, use of an IC with a digital portion and an analog portion (hereinafter, referred to as a digital/analog mixed IC) where a digital IC and an analog IC are integrated, has been increasing, to reduce a number of parts mounted on a substrate with further downsizing of portable communication devices (portable telephone or the like). In a digital/analog mixed IC, even if the power supplies and the grounds of respective circuits of the digital portion and the analog portion are separately installed and a bypass capacitor is attached to the IC, an attenuating of noise similar to that where the digital IC and the analog IC are used in combination, may be difficult to achieve. An explanation will be given of the reason as follows.

Firstly, to separately install the power supply wirings and the grounding wirings of the digital portion 2 and the analog portion 3 as shown by FIG. 33, the power supply wirings 4 for the digital portion and the grounding wirings 5 for the digital portion are installed at the side of the digital portion 2 and the power supply wiring 6 for the analog portion and the grounding wiring 7 for the analog portion are installed at the side of the analog portion 3. Thereafter, bypass capacitors are installed between the leads 9 connected to the power supply wirings and the grounding wirings as illustrated by FIG. 34.

However, the grounding of the digital portion 2 and the analog portion 3 are common since they are formed on the IC chip 1 that is formed on the same silicon substrate whereby the effect of attenuating noise is reduced. Further, the effect of attenuating noise is reduced by resistances of the leads 9, resistances of the wires 10 and contact resistances of these in the IC.

Accordingly, a desired characteristic is difficult to achieve in a digital/analog mixed IC since noise generated at the digital portion 2 influences the analog portion 3.

SUMMARY OF THE INVENTION

The conventional semiconductor integrated circuit is constituted as described above. The digital portion 2 and the analog portion 3 are formed in the same IC chip 1 whereby the grounding is common and, as shown by FIG. 34, bypass capacitors are attached between the leads 9 connected to the power supply wiring and the grounding wiring. Therefore, attenuation of noise is decreased by resistance of the leads 9, resistance of the wires 10 and contact resistance of these IC, so noise generated at the digital portion 2 influences the analog portion 3 and a desired characteristic is difficult to obtain.

The present invention has been carried out in order to solve the above-described problem and it is an object of the present invention to provide a semiconductor integrated circuit for attenuating generated noise with an incorporated bypass capacitor and it is an object of the present invention to provide a semiconductor integrated circuit having a layout designed by a cell base system effectively constituting the bypass capacitor.

According to a first aspect of the present invention, there is provided a semiconductor integrated circuit including a second electrode formed on a dielectric film to oppose a first electrode and constituting a capacity along with the first electrode and the dielectric film, a grounding wiring connected to either one of the first electrode and the second electrode, and a power supply wiring connected to either one of the first electrode and the second electrode which is not connected to the grounding wiring.

According to the first aspect of the present invention, the semiconductor integrated circuit includes the second electrode formed on the dielectric film to oppose the first electrode and constituting the capacity along with the first electrode and the dielectric film, the grounding wiring connected to either one of the first electrode and the second electrode, and the power supply wiring connected to either one of the first electrode and the second electrode which is not connected to the grounding wiring and therefore, the capacity can be connected directly to the power supply wiring and the grounding wiring in the semiconductor integrated circuit thereby achieving an effect capable of attenuating noise extremely preferably.

According to a second aspect of the present invention, there is provided a semiconductor integrated circuit having a layout designed by a cell base system, the circuit including a second electrode formed on a dielectric film to oppose a first electrode and constituting a capacity along with the first electrode and the dielectric film, a grounding wiring connected to either one of the first electrode and the second electrode by a first layer wiring, and a power supply wiring connected to either one of the first electrode and the second electrode which is not connected to the grounding wiring by the first layer wiring whereby a bypass capacitor is provided, wherein cell rows are constituted along with function cells each of which is arranged with predetermined logical circuits and makes common the grounding wiring and the power supply wiring and in each of which feed through cells unifying a width of the cell rows are provided.

According to the second aspect of the present invention, the semiconductor integrated circuit having a layout designed by a cell base system, includes the second electrode formed on the dielectric film to oppose the first electrode and constituting the capacity along with the first electrode and the dielectric film, the grounding wiring connected to either one of the first electrode and the second electrode by the first layer wiring and the power supply wiring connected to either one of the first electrode and the second electrode which is not connected to the grounding wiring by the first layer wiring, wherein the cell rows are constituted along with the function cells each of which is arranged with the predetermined logical circuits and makes common the grounding wiring and the power supply wiring and in each of which the feed through cells for unifying the width of the cell rows are provided and accordingly, in addition to functions of aligning the width and securing wiring regions of the feed through cells, the bypass capacitor can be connected directly to the power supply wiring and the grounding wiring in the semiconductor integrated circuit thereby achieving an effect capable of attenuating noise extremely preferably.

According to a third aspect of the present invention, there is provided a semiconductor integrated circuit including a second electrode formed on a dielectric film to oppose a first electrode and constituting a capacity along with the first electrode and the dielectric film, a grounding wiring connected to either one of the first electrode and the second electrode by a first layer wiring, a power supply wiring connected to either one of the first electrode and the second electrode which is not connected to the grounding wiring by the first layer wiring whereby a bypass capacitor is provided, wherein cell rows are constituted along with function cells each of which is arranged with predetermined logical circuits and makes common the grounding wiring and the power supply wiring and in each of which cap cells supplying a ground and supplying a power supply to the function cells are provided.

According to the third aspect of the present invention, the semiconductor integrated circuit includes the second electrode formed on the dielectric film to oppose the first electrode and constituting the capacity along with the first electrode and the dielectric film, the grounding wiring connected to either one of the first electrode and the second electrode by the first layer wiring, and the power supply wiring connected to either one of the first electrode and the second electrode which is not connected to the grounding wiring by the first layer wiring, wherein the cell rows are constituted along with the function cells each of which is arranged with the predetermined logical circuits and makes common the grounding wiring and the power supply wiring and in each of which the cap cells for supplying the ground and supplying the power supply to the function cells are provided and therefore, in addition to functions of supplying the power supply and supplying the ground of the cap cells, the bypass capacitor can be connected directly to the power supply wiring and the grounding wiring in the semiconductor integrated circuit thereby achieving an effect capable of attenuating noise extremely preferably.

According to a fourth aspect of the present invention, there is provided the semiconductor integrated circuit wherein the bypass capacitor is provided by forming a capacity comprising the first electrode, the dielectric film and the second electrode between the cell rows and by connecting the first electrode, the dielectric film and the second electrode of the capacity to the first electrode, the dielectric film and the second electrode of the feed through cell or the cap cell.

According to the fourth aspect of the present invention, the capacity constituted by the first electrode, the dielectric electric film and the second electrode is formed between the cell rows and the first electrode, the dielectric film and the second electrode of the capacity are connected to the first electrode, the dielectric film and the second electrode of the feed through cell or the cap cell and accordingly, the capacitance of the bypass capacitor can further be increased thereby achieving an effect capable of further enhancing the effect of attenuating noise.

According to a fifth aspect of the present invention, there is provided the semiconductor integrated circuit wherein the bypass capacitor constituted between the cell rows is formed at at least one of an upper end and a lower end of each of the cell rows at a predetermined height.

According to the fifth aspect of the present invention, the bypass capacitor constituted between the cell rows is formed at at least one of the upper end and the lower end of each of the cell rows at the predetermined height and accordingly, although the interval between the cell rows may differ for each of the cell rows, by forming the bypass capacitor at the constant height, the bypass capacitor can be designed uniformly with respect to any one of the cell rows without overlapping other one of the cell rows.

According to a sixth aspect of the present invention, there is provided the semiconductor integrated circuit wherein the bypass capacitor constituted between the cell rows is formed between an arbitrary one of the cap cells and one of the cap cells arranged to the arbitrary one of the cap cells in a vertical row over entire faces thereof.

According to the sixth aspect of the present invention, the bypass capacitor constituted between the cell rows is formed between the arbitrary one of cap cells and the one of the cap cells arranged to the arbitrary cap cell in a vertical row over entire faces thereof and accordingly, the capacitance of the bypass capacitor can further be increased thereby achieving an effect capable of further enhancing the effect of attenuating noise.

According to a seventh aspect of the present invention, there is provided the semiconductor integrated circuit wherein the bypass capacitor constituted between the cell rows is formed between an arbitrary one of the cell rows and one of the cell rows arranged to the arbitrary one of the cell rows in a vertical row over entire faces thereof.

According to the seventh aspect of the present invention, the bypass capacitor constituted between the cell rows is formed between the arbitrary one of the cell rows and one of the cell rows arranged to the arbitrary one of the cell rows in a vertical row over entire faces thereof and accordingly, the bypass capacitor can be arranged to expand over the entire faces between the cell rows thereby achieving an effect capable of further enhancing the effect of attenuating noise.

According to an eighth aspect of the present invention, there is provided the semiconductor integrated circuit wherein the bypass capacitor is constituted by arranging between the cell rows unit capacity cells each having a width of one basic cell, having a height of 1/n (n is an arbitrary integer) of a height between the cell rows and constituted by the first electrode, the dielectric film and the second electrode.

According to the eighth aspect of the present invention, the unit capacity cell having the width of one basic cell, having the height of 1/n (n is an arbitrary integer) of the height between the cell rows and constituted by the first electrode, the dielectric film and the second electrode is arranged between the cells rows thereby achieving an effect capable of arranging the bypass capacitor over the total of the wiring channels easily without producing clearances.

BRIEF DESCRIPTION OF THE DRAWINGS

FIG. 11 is a wiring diagram of an arrangement using feed through cells;

DETAILED DESCRIPTION OF THE PREFERRED EMBODIMENTS

An explanation will be given of embodiments of the present invention as follows.

Embodiment 1

An explanation will firstly be given of the cell base system method of a designing and fabricating a semiconductor integrated circuit (hereinafter, referred to as IC).

Figure 1:
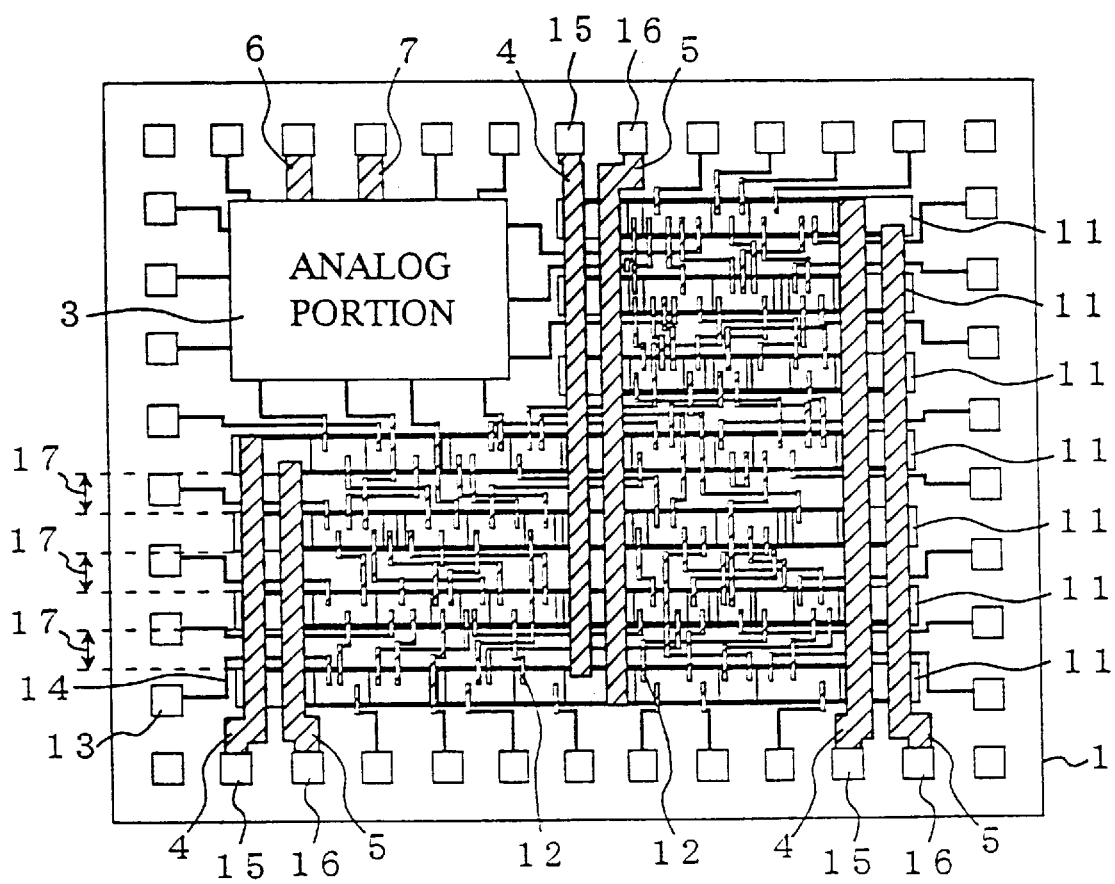
FIG. 1 is a conceptual view showing an IC chip having a layout designed by the cell base system.

FIG. 1 is a conceptual view showing an IC chip having a layout designed by the cell base system where numeral 1 designates an IC chip and numeral 3 designates an analog portion on the IC chip 1. Numeral 4 designates power supply wiring for a digital portion (hereinafter, referred to as power supply wiring), numeral 5 designates grounding wiring for the digital portion (hereinafter, referred to as grounding wiring), numeral 6 designates power supply wiring for an analog portion and numeral 7 designates grounding wiring for the analog portion.

Further, numeral 11 designates a plurality of cell rows where standard cells such as function cells constituting logical circuits, feed through cells unifying width, cap cells ground and supplying power to the function cells and the like, are arranged in the transverse direction, numeral 12 designates wiring connecting the standard cells, numeral 13 designates a pad used for inputting or outputting signals to and from outside of the IC chip 1, numeral 14 designates wiring for connecting the pad 13 and the standard cell, numeral 15 designates a pad for power supply, numeral 16 designates a pad for grounding, and numeral 17 designates a wiring channel constituting a wiring region of the wiring 12 for connecting the standard cells and located between adjacent cell rows 11.

According to the cell base system, logical circuits, such as an AND circuit, an OR circuit a, NOT circuit and the like, and circuits, such as flip flop circuits, that are a little complicated by combining the logical circuits, are prepared as function cells and logical design and layout design are carried out by combining these various function cells in designing an IC.

Further, a number of rows of the standard cells, each having a constant height and a width an integer times a unit width, are arranged as the cell rows 11 and arrangement of the standard cells is determined by using a computer such that a total length of wirings connecting the respective standard cells is shortened. Thereafter, the wiring pattern and width of the wiring channels 17 are determined.

Here, the wiring channel 17 is a wiring region between the adjacent cell rows 11 having a height that varies depending on the crowdedness of the wiring pattern in the wiring channel 17, which is different from that in a gate array system. That is, if the degree of crowdedness is high, the height of the wiring channel 17 is expanded and, by contrast, when the degree of crowdedness is low, the height of the wiring channel 17 is shrunk.

Next, an explanation will be given of the standard cell used in the IC chip 1 designed using the cell base system in reference to FIG. 2 through FIG. 6.

Figure 2:
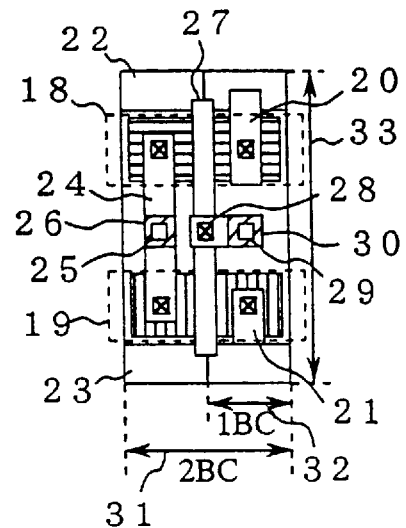
FIG. 2 is a layout view showing an inverter.
Figure 3:
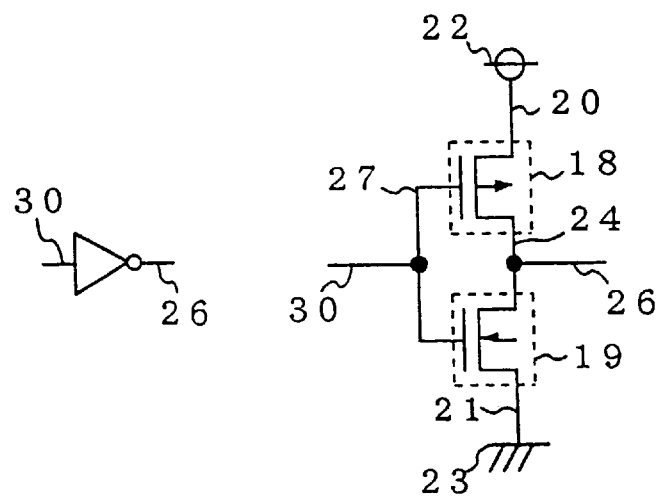
FIG. 3 is a logical circuit diagram showing the inverter cell and a circuit diagram at a transistor level.

FIG. 2 is a layout view showing an inverter cell and FIG. 3 is a logical circuit diagram showing an inverter cell and a circuit diagram at a transistor level. In FIG. 2 and FIG. 3, numeral 18 designates a P-channel transistor (hereinafter, referred to as Pch-Tr), numeral 19 designates a N-channel transistor (hereinafter, referred to as Nch-Tr), numerals 20 and 21 designate source side wirings of Pch-Tr 18 and Nch-Tr 19 and numerals 22 and 23 designate a power supply wiring and a grounding wiring. Further, numeral 24 designates a drain side wiring of Pch-Tr 18 and Nch-Tr 19, numeral 25 designates a through hole and numeral 26 designates an output pin. Numeral 27 designates a gate wiring of Pch-Tr 18 and Nch-Tr 19, numeral 28 designates a contact hole, numeral 29 designates a through hole, numeral 30 designates an input pin, numeral 31 designates a cell width, numeral 32 designates one basic cell that is a basic unit of the cell width (hereinafter, basic cell is referred to as BC) and numeral 33 designates a cell height.

As shown by FIG. 2, the source side wirings 20 and 21 of the respective Pch-Tr 18 and Nch-Tr 19, are formed by first layer wirings and are connected to the power supply wiring 22 and the grounding wiring 23 which are similarly formed by first layer wirings. Further, the drain side wiring 24 of Pch-Tr 18 and Nch-Tr 19, is formed by a first layer wiring and commonly connected and connected to the output pin 26 formed by a second layer wiring via the through hole 25. The gate wiring 27 of Pch-Tr 18 and Nch-Tr 19 are commonly connected, connected to a first layer wiring via the contact hole 28 and connected to the input pin 30 formed by a second layer wiring via the through hole 29. The input pin 30 and the output pin 26 are connected to other standard cells by the second layer wirings.

The cell width 31 of the inverter cell is twice as much as 1BC 32 so the cell width 31 is 2BC. Further, the cell height 33 of the inverter cell is unified as the standard cell. A detailed explanation of the cell operation will be omitted since it is irrelevant to the present invention.

Figure 4:
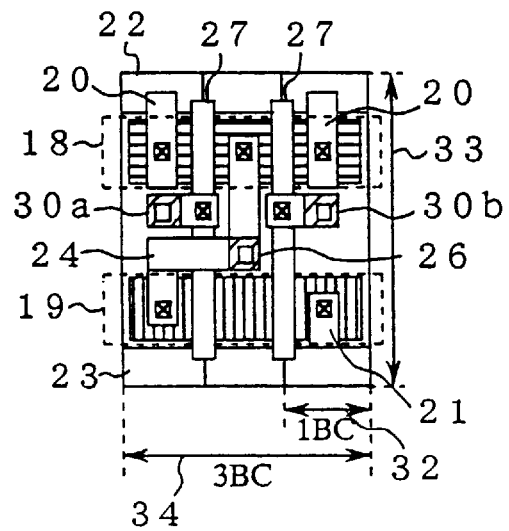
FIG. 4 is a layout view showing a NAND cell.
Figure 5:
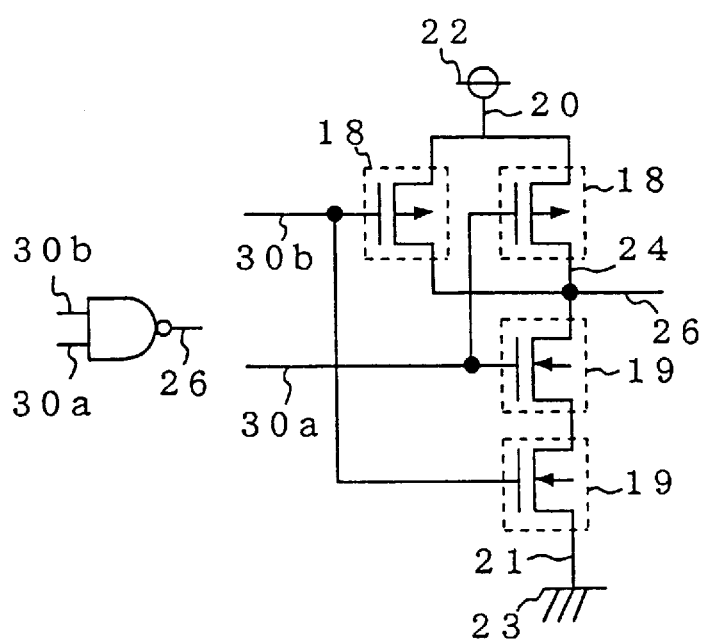
FIG. 5 is a logical circuit diagram showing the NAND cell and a circuit diagram at a transistor level.

FIG. 4 is a layout view showing a NAND cell and FIG. 5 is a logical circuit diagram showing a NAND cell and a circuit diagram at a transistor level where notations 30a and 30b designate input pins and numeral 34 designates the cell width of the NAND cell.

The other constitutions are the same as those in FIG. 2 and FIG. 3 and therefore, a duplicated explanation will be omitted.

The source side wirings 20 and 21 of the respective Pch-Tr 18 and Nch-Tr 19 are formed by the first layer wirings and connected to the power supply wiring 22 and the grounding wiring 23. Further, input pins 30a and 30b and the output pin 26 are connected to other standard cells by the second layer wirings.

Also, the cell width 34 of the NAND cell is three times as much as 1BC 32 and the cell width 34 is 3BC. The cell height 33 of the NAND cell is unified as the standard cell. An explanation of a detailed cell operation will be omitted since it is irrelevant to the present invention.

Figure 6:
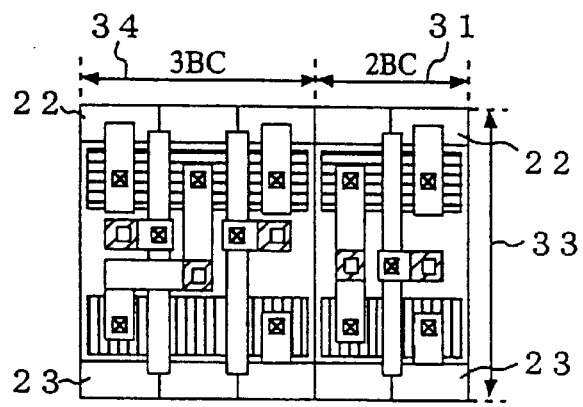
FIG. 6 is a layout view where the inverter cell and the NAND cell are arranged in the transverse direction.

FIG. 6 is a layout view where an inverter cell and a NAND cell are arranged in the transverse direction. As shown by FIG. 6, the power supply wirings 22 and the grounding wirings 23 of the inverter cell and the NAND cell are commonly connected. Also, as shown by FIG. 1, a plurality of standard cells previously prepared in this way and arranged in the transverse direction are referred to as the cell rows 11.

Next, an explanation will be given of a design method according to the cell base system in reference to FIG. 7 through FIG. 14.

Firstly, an explanation will be given of a function of cells of which widths are aligned (hereinafter, referred to as feed through cell).

Figure 7:
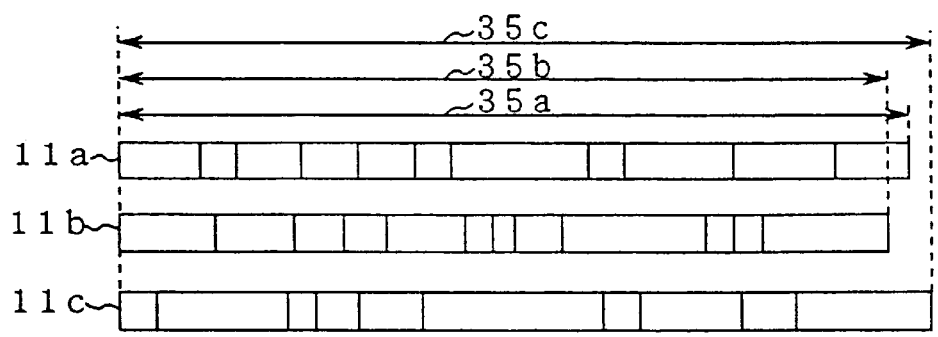
FIG. 7 is an explanatory view showing an example of arranging cell rows.

As shown by FIG. 7, although widths 35a through 35c of the cell rows 11a through 11c, in each of which a plurality of standard cells is constituted by an integer times 1BC are arranged in the transverse direction, are an integer times 1BC, they differ for each of the cell rows 11a through 11c. Hence, a feed through cell shown by FIG. 8 is used to align the widths 35a through 35c of the cell rows 11a through 11c.

Figure 8:
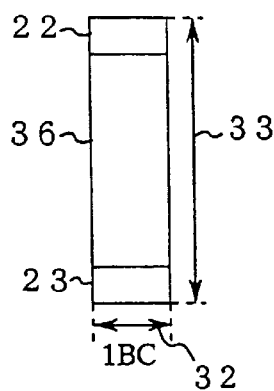
FIG. 8 is a layout view showing a feed through cell.

FIG. 8 is a layout view showing a feed through cell in which the cell width 32 of a feed through cell 36 is 1BC and the cell height 33 is unified as the standard cell. Further, the feed through cell 36 includes the power supply wiring 22 and the grounding wiring 23.

Figure 9:
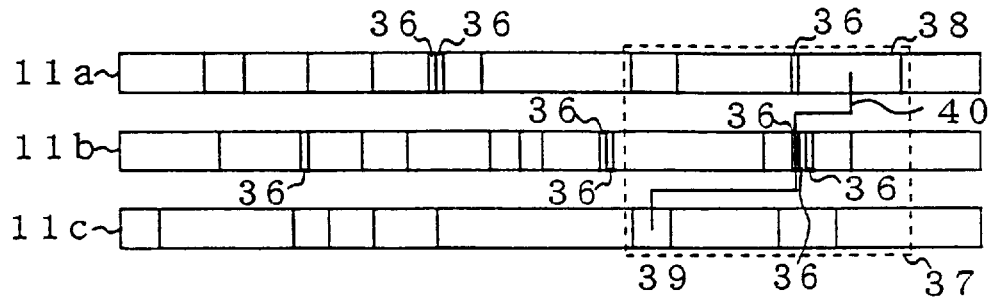
FIG. 9 is an explanatory view showing the function of the feed through cell.

FIG. 9 shows an example where the widths of the cell rows 11a through 11c are aligned by inserting feed through cells 36. In this way, in the cell row 11a, three of the feed through cells 36 are added and arranged, in the cell row 11b, six of the feed through cells 36 are added and arranged to make the width of the cell row the same as that of the cell row 11c having the largest width of the cell rows.

The feed through cell 36 has an object of securing a wiring region besides the object of aligning the widths of the cell rows.

A detailed explanation will be given in reference to FIG. 10 and FIG. 11, which magnifies a range 37 of FIG. 9.

Figure 10:
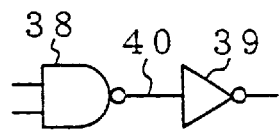
FIG. 10 is a logical circuit diagram showing an example.

When a NAND cell 38 of the logical circuit of FIG. 10 is arranged in the cell row 11a shown by FIG. 11, and an inverter cell 39 is arranged in the cell row 11c, a wiring 40 for connecting an output from the NAND cell 38 and an input to the inverter cell 39 must cross cell row 11b. In this case, by using one of the feed through cells 36 arranged to the cell row 11b, as shown by FIG. 11, the output from the NAND cell 38 can be connected to the input to the inverter cell 39 by crossing the feed through cell 36 in the cell row 11b through the wiring 40 formed by the second layer wiring.

As has been explained, the feed through cell aligns the widths of the cell rows as well as providing a wiring region.

Next, an explanation will be given of the function of a cell for supplying power and ground (hereinafter, referred to as cap cell).

Figure 12:
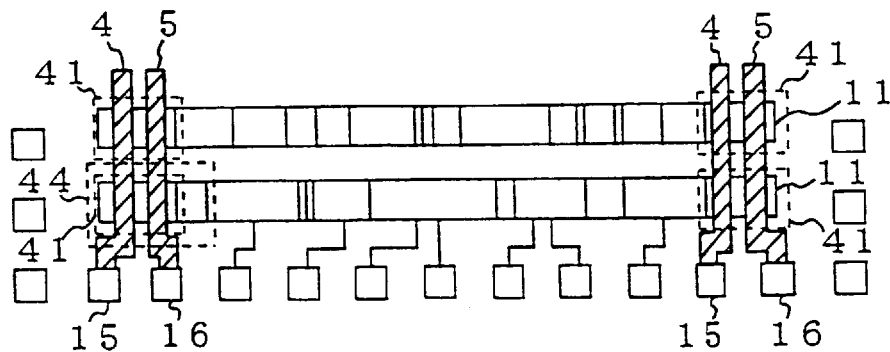
FIG. 12 is a conceptual view showing a layout pattern of a digital/analog mixed IC chip.

In FIG. 12, numerals 4 and 5 designate power supply wiring and grounding wiring formed by second layer wirings, numerals 15 and 16 designate a power pad and a ground pad, numeral 11 designates a cell row and numeral 41 designates cap cells arranged at both ends of the cell row 11 where the cap cells 41 are connected to the power supply wiring 4 and the grounding wiring 5.

Figure 13:
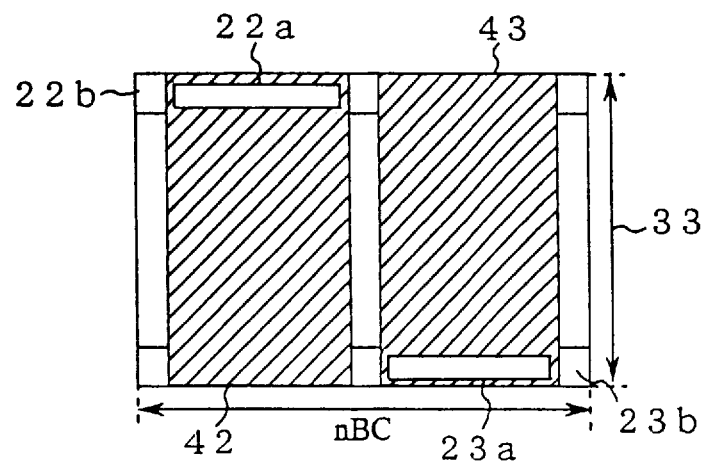
FIG. 13 is a layout view of a cap cell.

An explanation will be given of the constitution of the cap cell used here in reference to FIG. 13. In FIG. 13, numeral 42 designates power supply wiring formed by a second layer wiring, which is connected to a power supply wiring 22b formed by a first layer wiring via a through hole 22a. Numeral 43 designates grounding wiring formed by a second layer wiring, which is connected to a grounding wiring 23b formed by a first layer wiring via a through hole 23a.

Further, the cell width is nBC (n is an arbitrary integer) and the cell height 33 is unified as the standard cell.

Figure 14:
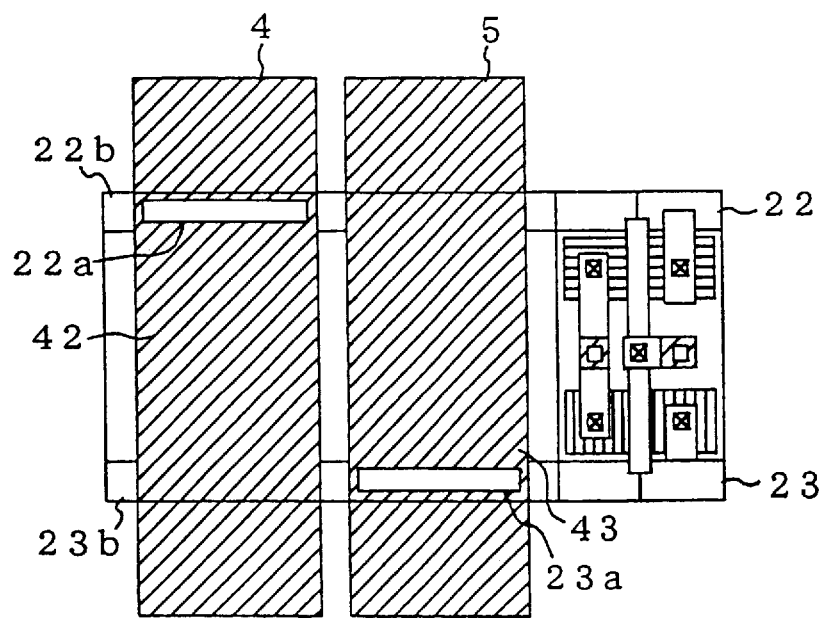
FIG. 14 is a view magnifying a region 44.

Next, an explanation will be given of how power supply and grounding are carried out in respect of each of the cell rows 11 by using the cap cells 41 in reference to FIG. 14. FIG. 14 is a view magnifying a range 44 of FIG. 12.

Power supply wiring 42 is connected to the power supply wiring 4 connected to the power pad 15 and the grounding wiring 43 is connected to the grounding wiring 5 connected to the ground pad 16 and the wirings 42 and 43 are, respectively, formed by second layer wirings.

In this way, the power supply wiring 22 and the grounding wiring 23 of the respective standard cell of the cell row 11 are connected to the power pad 15 and the ground pad 16 via the cap cells 41 whereby power is supplied and grounding is provided.

As has been explained, according to the layout design by the cell base system, in forming logical circuits which are the target of the layout, cell rows are formed using a plurality of function cells which have been previously prepared, and arranging the plurality of function cells in the transverse direction. Further, widths of the plurality of cell rows are made the same by using feed through cells, wirings is connected among the respective cells and wirings for supplying power and ground are connected for each of the cell rows, thereby forming the layout of an IC chip as shown by FIG. 1.

Next, an explanation will be given of an IC chip incorporating a bypass capacitor.

Figure 15:
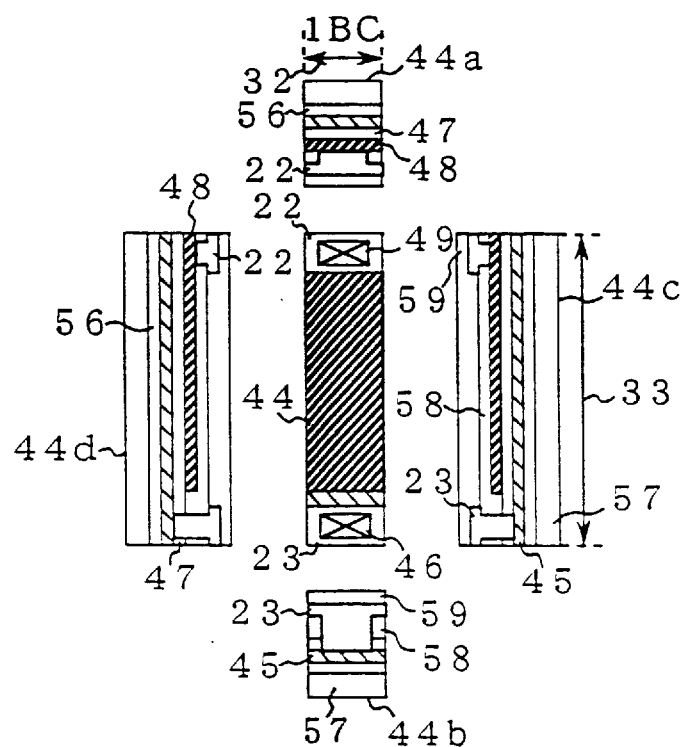
FIG. 15 is a layout view showing a feed through cell according to Embodiment 1 of the present invention.
Figure 16:
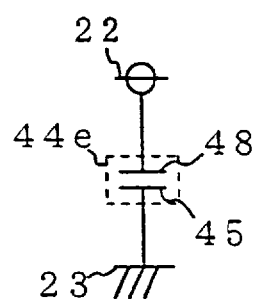
FIG. 16 is a circuit diagram of a feed through cell.

FIG. 15 is a layout view showing a feed through cell according to Embodiment 1 of the present invention and FIG. 16 is a circuit diagram of a feed through cell. In FIG. 15, notations 44a through 44d designate an upper sectional view, a lower sectional view, a right sectional view and a left sectional view of the feed through cell 44. Here, a plan view shows data necessary for a computer in layout design and the sectional views illustrate a fabricated IC and therefore, there are portions where the sectional views do not correspond with the plan view. For example, contact holes 46 and 49 designate holes perforating an insulating oxide film or the like for connecting an electrode and a wiring in a fabricating operation.

In FIG. 15, numeral 57 designates a silicon substrate, numeral 56 designates an inter-layer film formed on the silicon substrate 57, numeral 45 designates a first electrode formed on the inter-layer film 56, numeral 47 designates a dielectric film formed on the first electrode 45 and numeral 48 designates a second electrode formed on the dielectric film 47 opposite the first electrode 45 whereby a capacitor 44e is constituted along with the first electrode 45 and the dielectric film 47. Numeral 58 designates a first insulating oxide film formed on the second electrode 48 and numeral 59 designates a second insulating oxide film formed on the first insulating oxide film 58. Further, numeral 22 designates a power supply wiring connected to the second electrode 48 by the first layer wiring via the contact hole 49 and numeral 23 designates grounding wiring connected to the first electrode 45 by the first layer wiring via the contact hole 46.

Further, numeral 32 designates that the cell width is 1BC and the cell height 33 is the standard cell height.

An explanation will be given of the operation as follows.

The first electrode 45 is connected to the grounding wiring 23 formed by the first layer wiring via the contact hole 46. The second electrode 48 arranged opposite the first electrode 45 via the dielectric film 47, is connected to the power supply wiring 22 formed by the first layer wiring via the contact hole 49. Accordingly as shown by FIG. 16, a capacitor is constituted by the first electrode 45, the dielectric film 47 and the second electrode 48 and the capacitor 44e for forming a bypass capacitor is constituted by connection it to the power supply wiring 22 and the grounding wiring 23.

Also, the inter-layer film 56 insulates the silicon substrate 57 from the first electrode 45, the first insulating oxide film 58 insulates the second electrode 48 from the first layer wiring and the second insulating oxide film 59 insulates the first layer wiring from the second layer wiring.

Furthermore, the silicon substrate 57, the inter-layer film 56, the first insulating oxide film 58 and the second insulating oxide film 59 are necessary in fabricating an IC but data thereof is not necessary in designing the layout.

An explanation will be omitted of detailed cell operation since it is irrelevant to the essence of the present invention.

Figure 17:
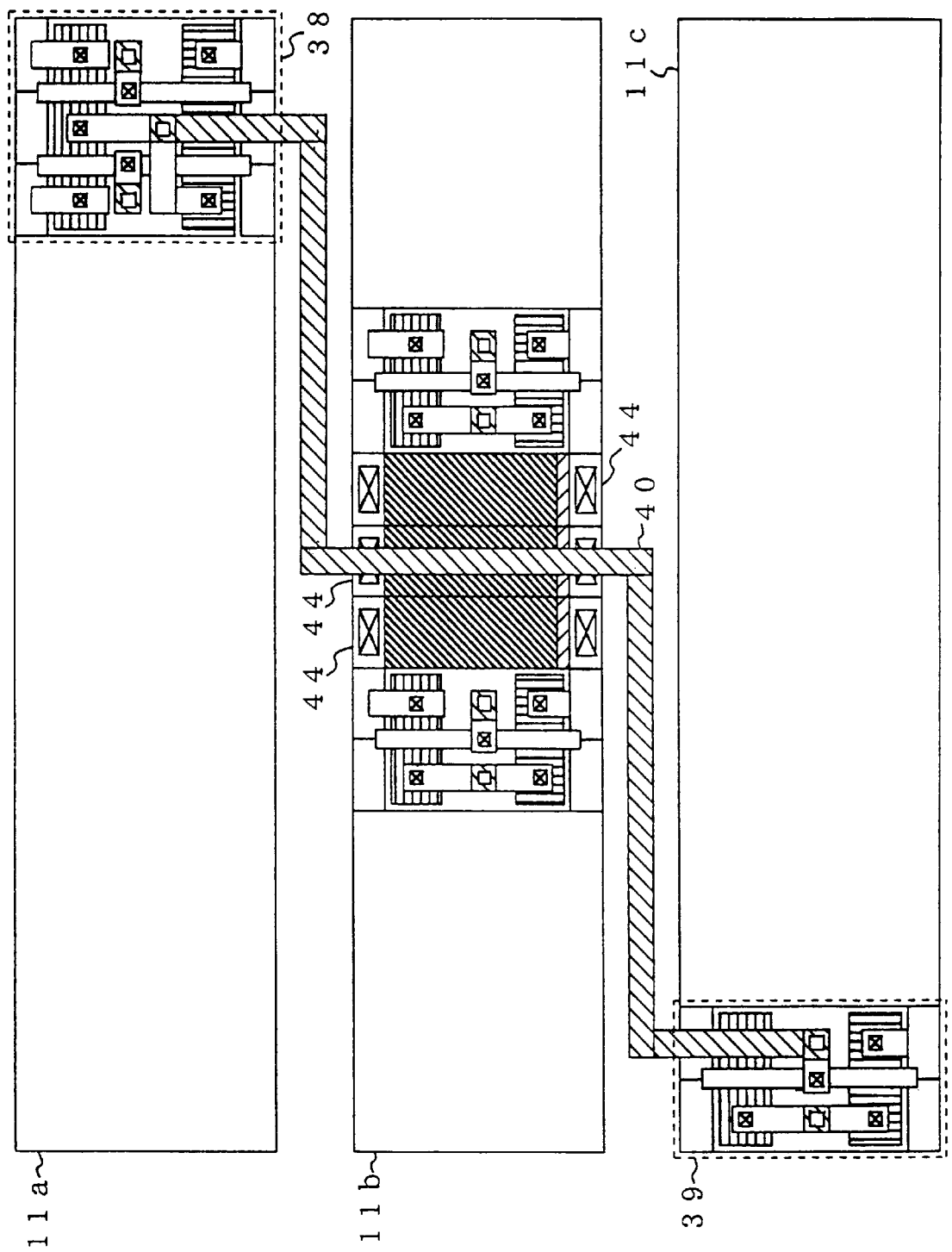
FIG. 17 is a circuit diagram of an arrangement using feed through cells.

Next, an explanation will be given of an example of arranging the feed through cells of Embodiment 1 in reference to FIG. 17.

Three of the feed through cells 44 of Embodiment 1 are arranged in place of 3 of the feed through cells 36 illustrated by FIG. 11 and arranged in the transverse direction. As shown by FIG. 17, the output from the NAND cell 38 can be connected to the input to the inverter cell 39 by crossing the feed through cell 44 in arranged at the cell row 11b with the second layer wiring.

Further, the feed through cell 44 constitutes the capacitor 44e that forms a bypass capacitor by connection to the power supply wiring 22 and the grounding wiring 23. The power supply wiring 22 and the grounding wiring 23 are connected to other function cells and are commonly used and therefore, the bypass capacitor 44e is directly connected to the power supply wiring 22 and the grounding wiring 23 of the digital portion in the IC chip whereby noise can be highly attenuated.

Incidentally, although an explanation has been given of a semiconductor integrated circuit of which the layout is designed by the cell base system according to Embodiment 1, a bypass capacitor is formed and a similar effect is achieved also with respect to a semiconductor integrated circuit constituted by a gate array system by forming the capacitor 44e constituted by the first electrode 45, the dielectric film 47, and the second electrode 48, and by connecting it to the power supply wiring 22 and the grounding wiring 23.

Further, although the grounding wiring 23 is connected to the first electrode 45 and the power supply wiring 22 is connected to the second electrode 48, a similar effect is achieved by connecting the power supply wiring 22 to the first electrode 45 and connecting the grounding wiring 23 to the second electrode 48.

As has been explained, according to Embodiment 1, the capacitor 44e constituted by the first electrode 45, the dielectric film 47 and the second electrode 48, is formed in the feed through cell 44 and it is connected to the power supply wiring 22 and the grounding wiring 23 and therefore, in addition to forming a bypass capacitor, width aligning and providing a wiring region of the feed through cell 44, the bypass capacitor 44e is directly connected to the power supply wiring 22 and the grounding wiring 23 in the IC chip 1 whereby noise can be highly attenuated Embodiment 2

Figure 18:
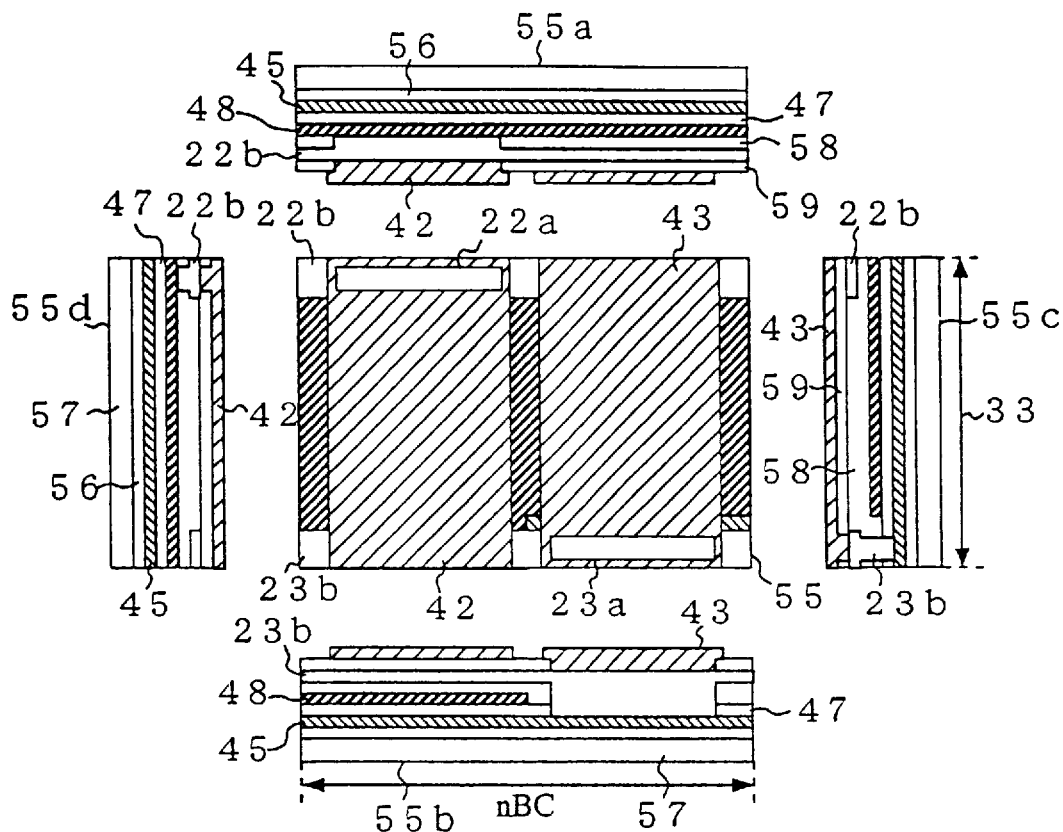
FIG. 18 is a layout view showing a cap cell according to Embodiment 2 of the present invention.

FIG. 18 is a layout view showing a cap cell according to Embodiment 2 of the present invention. In FIG. 18, notations 55a through 55d designate an upper sectional view, a lower sectional view, a right sectional view and a left sectional view of a cap cell 55. Here, the through holes 22a and 23a perforate the first insulating oxide film connecting the first layer wiring and the second layer wiring. Also, the contact holes overlap the through holes 22a and 23a and accordingly, they are not illustrated.

In FIG. 18, numeral 57 designates a silicon substrate, numeral 56 designates an inter-layer film formed on the silicon substrate 57, numeral 45 designates a first electrode formed on the inter-layer film 56, numeral 47 designates a dielectric film formed on the first electrode 45 and numeral 48 designates a second electrode formed on the dielectric film 47 opposite the first electrode 45 and constitutes a capacitor along with the first electrode 45 and the dielectric film 47. Numeral 58 designates a first insulating oxide film formed on the second electrode 48 and numeral 59 designates a second insulating oxide film formed on the first insulating oxide film 58. Notation 22b designates a power supply wiring connected to the second electrode 48 by the first layer wiring via the contact hole and notation 23b designates a grounding wiring connected to the first electrode 45 by the first layer wiring via the contact hole.

Numeral 42 designates power supply wiring connected to the power supply wiring 22b formed by the first layer wiring via the through hole 22a and numeral 43 designates grounding wiring connected to the grounding wiring 23b formed by the first layer wiring via the through hole 23a.

Furthermore, the cell width designates that it is nBC and the cell height 33 is unified as the standard cell height.

Next, an explanation will be given of the operation.

The first electrode 45 is connected to the grounding wiring 23b formed by the first layer wiring via the contact hole. Further, the second electrode 48 arranged to oppose the first electrode 45 via the dielectric film 47 is connected to the power supply wiring 22b formed by the first layer wiring via the contact hole. Accordingly, a bypass capacitor connected to the power supply wiring 22b and the grounding wiring 23b can be constituted by the first electrode 45, the dielectric film 47 and the second electrode 48.

Further, the inter-layer film 56 insulates the silicon substrate 57 from the first electrode 45, the first insulating oxide film 58 insulates the second electrode 48 from the first layer wiring and the second insulating oxide film 59 insulates the first layer wiring from the second layer wiring.

Furthermore, the silicon substrate 57, the inter-layer film 56, the first insulating oxide film 58 and the second insulating oxide film 59 are necessary in fabricating an IC and data concerning them is not needed in the layout design.

An explanation will be omitted of detailed cell operation since it is irrelevant to the essence of the present invention.

Next, an explanation will be given of an example of arranging the cap cell according to Embodiment 2 in reference to FIG. 14. The cap cell 55 according to Embodiment 2 is arranged in place of the cap cell shown by FIG. 14. The cap cell 55 constitutes a bypass capacitor connected to the power supply wiring 22b and the grounding wiring 23b, the power supply wiring 22b and the grounding wiring 23b are used commonly with other function cells and, accordingly, the bypass capacitor is directly connected to the power supply wiring 22b and the grounding wiring 23b at the digital portion in the IC chip whereby noise can be highly attenuated.

Incidentally, although an explanation has been given of a semiconductor integrated circuit having a layout designed by the cell base system, a similar effect can be achieved also with respect to a semiconductor integrated circuit constituted by another gate array system by forming a bypass capacitor constituted by the first electrode 45, the dielectric film 47 and the second electrode 48 and by connecting it to the power supply wiring 22b and the grounding wiring 23b.

Furthermore, although the grounding wiring 23b is connected to the first electrode 45 and the power supply wiring 22b is connected to the second electrode 48 according to Embodiment 2, a similar effect is achieved by connecting the power supply wiring 22b to the first electrode 45 and by connecting the grounding wiring 23b to the second electrode 48.

As has been described, according to Embodiment 2, the bypass capacitor constituted by the first electrode 45, the dielectric film 47 and the second electrode 48 is formed in the cap cell 55 and the bypass capacitor is connected to the power supply wiring 22b and the grounding wiring 23b and, accordingly, in addition to supplying power and supplying ground of the cap cell 55, the bypass capacitor is connected directly to the power supply wiring 22b and the grounding wiring 23b of the digital portion in the IC chip 1 whereby noise can be highly attenuated.

Embodiment 3

Figure 19:
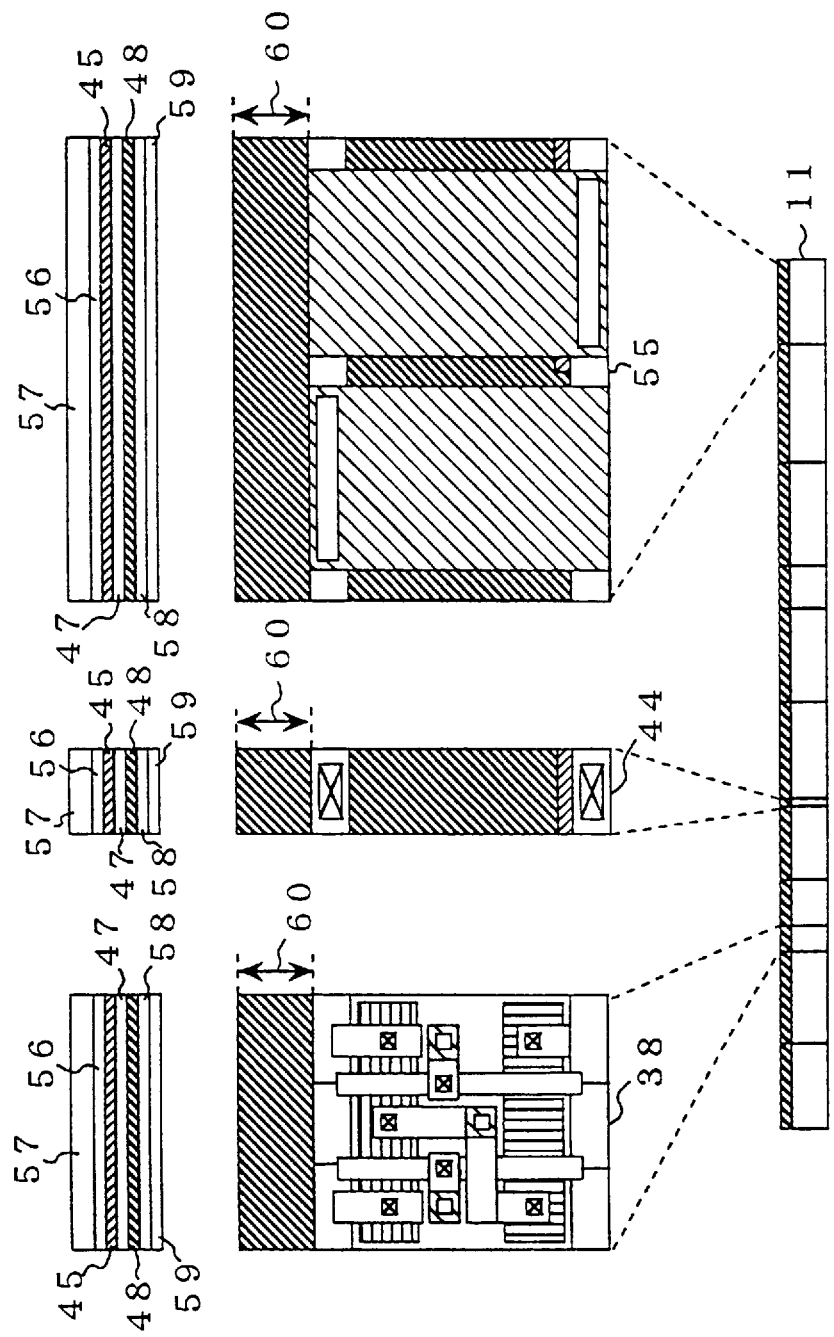
FIG. 19 is a layout view showing a cell row according to Embodiment 3 of the present invention.

FIG. 19 is a layout view showing a cell row according to Embodiment 3 of the present invention. In FIG. 19, numeral 60 designates a capacitor having layers the same as those of the feed through cell 44 and the cap cell 55, which is formed on the upper side of a cell row 11 at a constant height wherein these layers and the layers of the feed through cell 44 and the cap cell 55 are connected. That is, the capacitor 60 is constituted by the silicon substrate 57, the inter-layer film 56, the first electrode 45, the dielectric film 47, the second electrode 48, the first insulating oxide film 58 and the second insulating oxide film 59 which are connected to the respective layers of the feed through cell 44 and the cap cell 55 comprising the same layers.

An explanation will be given of the operation as follows.

As shown by FIG. 19, the capacitor 60 is formed at the upper side of the cell row 11 at a constant height and layers thereof are connected to respective layers of the feed through cell 44 shown by Embodiment 1 and the cap cell 55 shown by Embodiment 2. The first electrode 45 of the capacitor 60 is connected to the grounding wiring 23 via the first electrodes 45 of the feed through cell 44 and the cap cell 55 and the second electrode 48 of the capacitor 60 is connected to the power supply wiring 22 via the second electrodes 48 of the feed through cell 44 and the cap cell 55 thereby forming a bypass capacitor.

By forming the capacitor 60 in this way, the capacitance of the bypass capacitor can be increased by which the effect of attenuating noise can be further enhanced.

Incidentally, although both of the feed through cell 44 of Embodiment 1 and the cap cell 55 of Embodiment 2 are used in Embodiment 3, the capacitor may be formed at either one of the feed through cell 44 and the cap cell 55 whereby substantially similar effect is achieved, even by connecting the respective layers of the feed through cell 44 or the cap cell 55 where the capacitor is formed with the respective layers.

As described above, according to Embodiment 3, the capacitor 60 having the same layers as the feed through cell 44 or the cap cell 55 are formed at the upper side of the cell row 11 at a constant height and, accordingly, the capacitance of the bypass capacitor can further be increased and the effect of attenuating noise can further, be enhanced.

Also, although the interval between the adjacent cell rows 11 differs for each of the cell rows, the capacitor 60 does not overlap another one of the cell rows 11 and the interval can be designed uniformly with respect to any one of the cell rows 11 by forming the capacitor 60 with a constant height.

Embodiment 4

Figure 20:
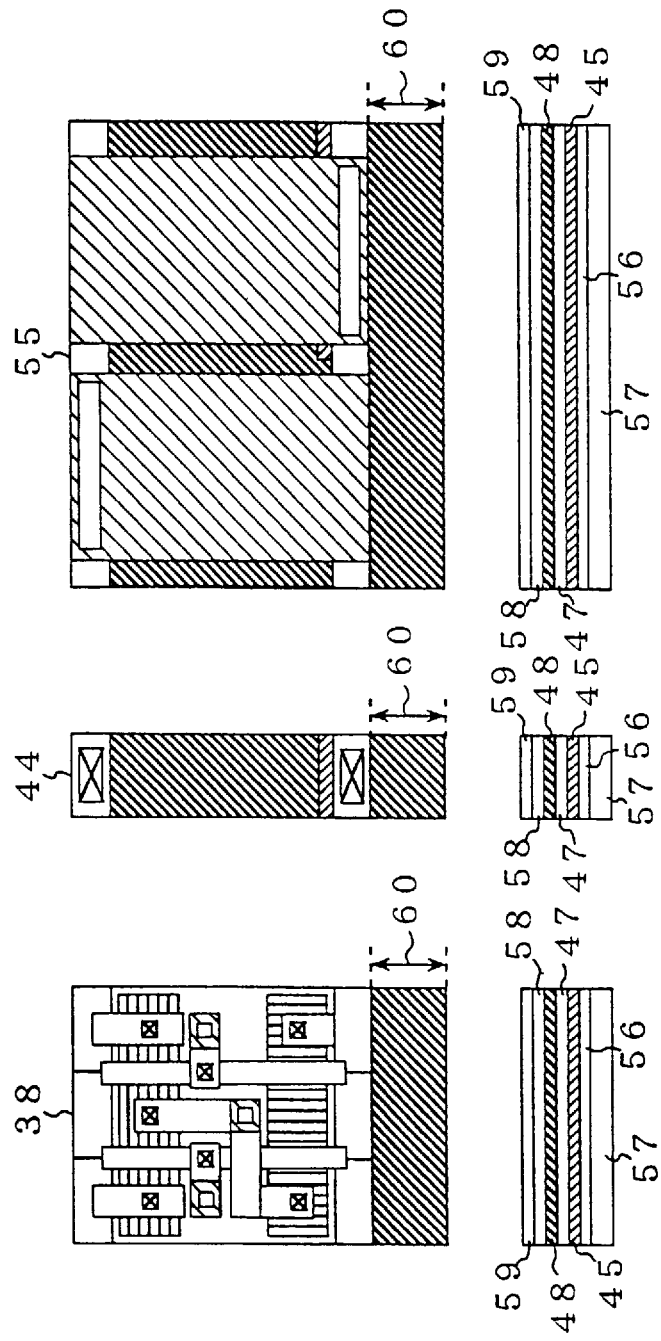
FIG. 20 is a layout view showing a cell row according to Embodiment 4 of the present invention.

FIG. 20 is a layout view showing a cell row according to Embodiment 4 of the present invention where the capacitor 60 is formed at the lower side of the cell row 11 at a constant height. The other elements are the same as those of FIG. 19 and, therefore, a duplicated explanation is omitted.

As described above, according to Embodiment 4, the capacitor 60 is formed at the lower side of the cell row 11 at a constant height and accordingly, an effect the same as that of Embodiment 3 is achieved.

Embodiment 5

Figure 21:
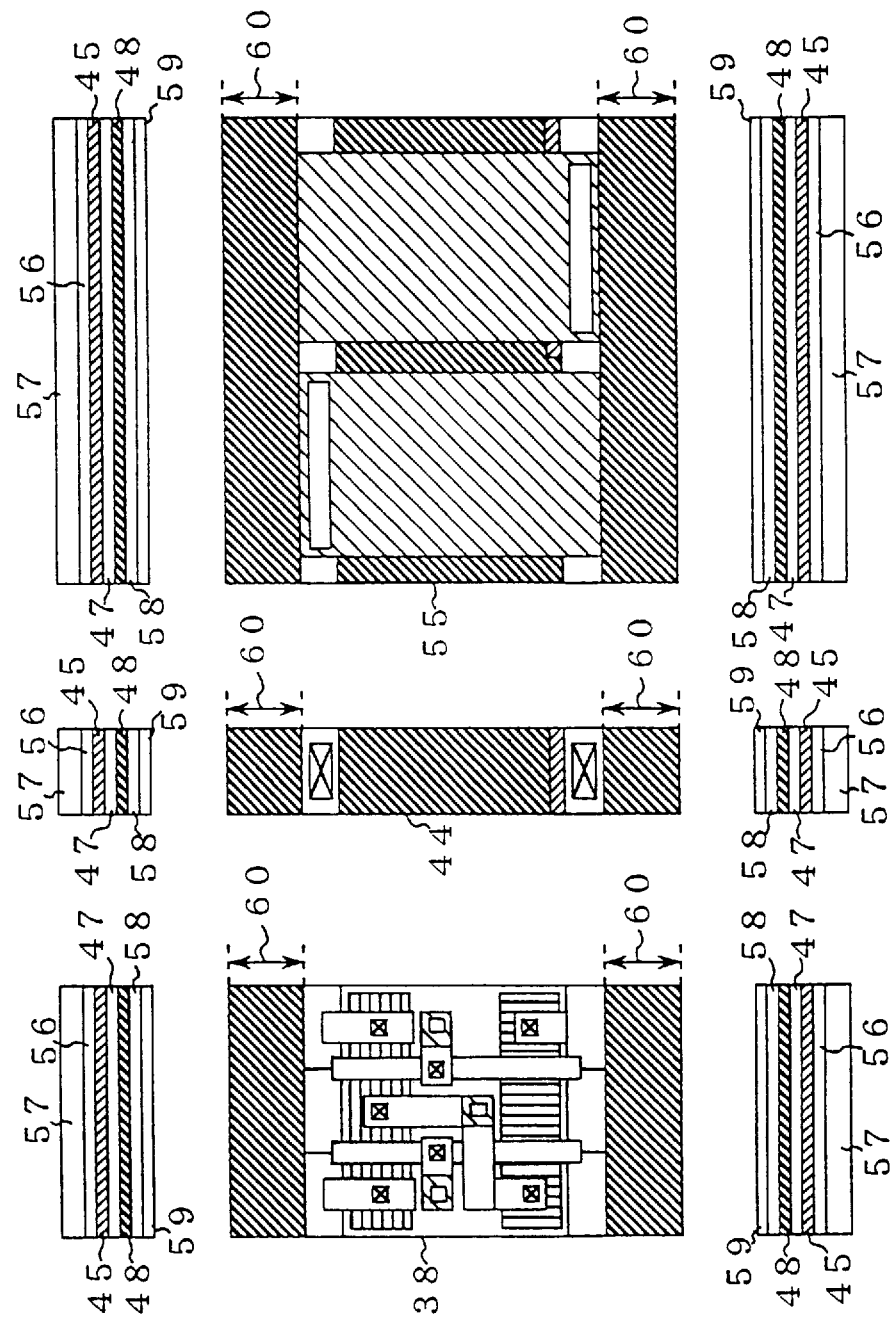
FIG. 21 is a layout view showing a cell row according to Embodiment 5 of the present invention.

FIG. 21 is a layout view showing a cell row according to Embodiment 5 of the present invention where the capacitor 60 are formed at the upper side and the lower side of the cell row 11, both at a constant height.

The other elements are the same as those of FIG. 19 and FIG. 20 and accordingly, a duplicated explanation is omitted.

As described above, according to Embodiment 5, the capacitor 60 are formed at the upper and lower sides of the cell row 11 both at a constant height and, therefore, an effect the same as that of Embodiment 3 can be achieved and further, the capacitance of the bypass capacitor can further be enhanced.

Embodiment 6

Figure 22:
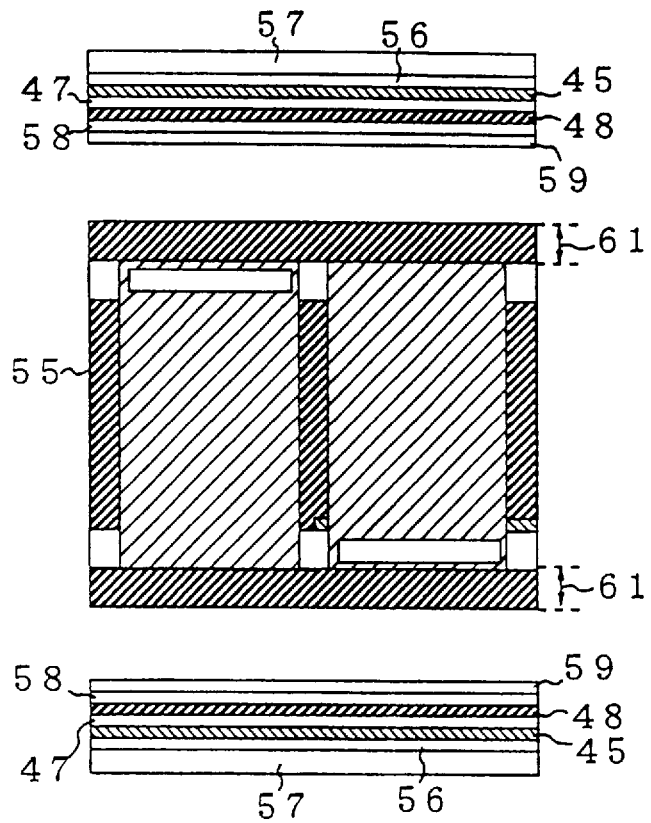
FIG. 22 is a layout view showing a cap cell according to Embodiment 6 of the present invention.
Figure 23:
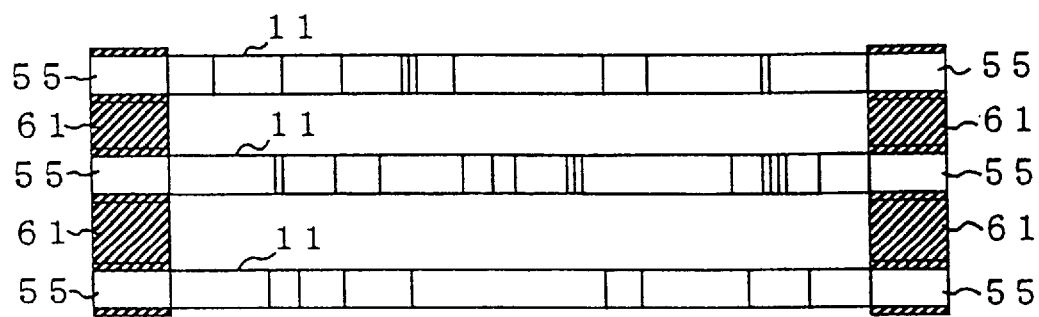
FIG. 23 is a layout view showing cell rows.

FIG. 22 is a layout view showing a cap cell according to Embodiment 6 of the present invention and FIG. 23 is a layout view showing cell rows. In FIG. 22 and FIG. 23, numeral 61 designates a bypass capacitor having layers the same as those of the cap cell 55, which is formed between a cap cell 55 in one row and another cap cell 55 in another row over entire faces thereof whereby these layers and the layers of the cap cells 55 are connected.

That is, the bypass capacitor 61 is constituted by the silicon substrate 57, the inter-layer film 56, the first electrode 45, the dielectric film 47, the second electrode 48, the first insulating oxide film 58 and the second insulating oxide film 59, which are connected to the respective layers of the cap cells 55 comprising the same layers.

An explanation will be given of the operation as follows.

As shown by the above-described FIG. 11, the wiring 40 is arranged by connecting pins by the second layer wirings. The pin comprises the second layer wiring, the property referred to as a pin is given for conducting wirings by a computer in layout design and also the wiring 40 is the second layer wiring quite the same as that of the pin in a fabricated IC.

First, pins having the respective properties of the first electrode 45, the dielectric film 47 and the second electrode 48 are added to both upper and lower ends of the cap cell 55 shown by Embodiment 2 at a constant height. Here, the layers of the first electrode 45, the dielectric film 47 and the second electrode 48 which are added, are connected to the respective corresponding layers of the cap cell 55 in Embodiment 2. As shown by FIG. 23, after arranging standard cells in the cell rows 11, by connecting the pins having the respective properties of the first electrodes 45, the dielectric film 47 and the second electrode 48, to the corresponding respective layers, the bypass capacitor 61 can be formed between one cap cell 55 and another cap cell 55 above the former cap cell 55 in a vertical row.

As described above, according to Embodiment 6, by designating the pins having the respective properties of the first electrode 45, the dielectric film 47 and the second electrode 48, the bypass capacitor 61 is located between one cap cell 55 and another cap cell 55 in a vertical row and, accordingly, the capacitance of the bypass capacitor can further be increased and the effect of attenuating noise can further be enhanced. Although the interval between the adjacent cell rows 11 may differ at each of the cell rows 11, the bypass capacitor 61 can be prevented from overlapping other one of the cell rows 11 by connecting the pins having the respective properties by respective corresponding layers.

Embodiment 7

Figure 24:
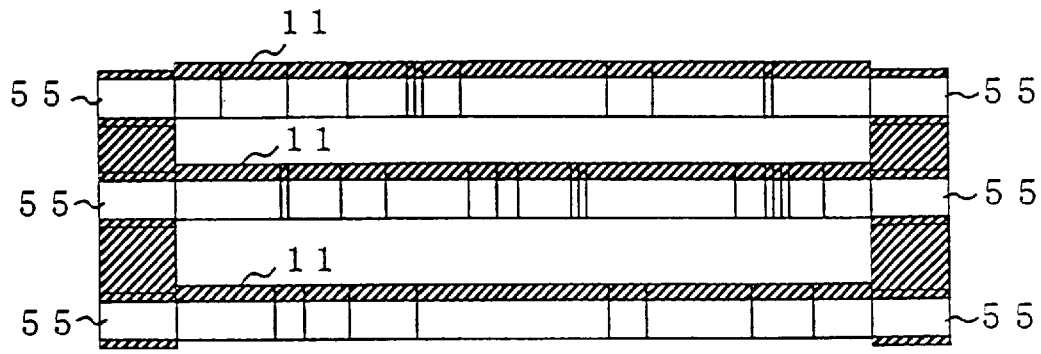
FIG. 24 is a layout view showing cell rows according to Embodiment 7 of the present invention.

FIG. 24 is a layout view showing cell rows according to Embodiment 7 of the present invention where Embodiment 3 and Embodiment 6 are combined. However, the cap cell 55 of Embodiment 6 is used.

As described above, according to Embodiment 7, since Embodiment 3 and Embodiment 6 are combined, the capacitance of the bypass capacitor can further be increased and the effect of attenuating noise can further be enhanced.

Embodiment 8

Figure 25:
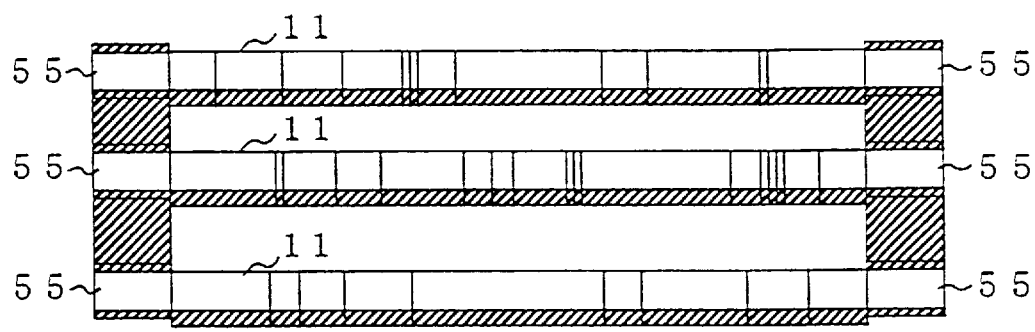
FIG. 25 is a layout view showing cell rows according to Embodiment 8 of the present invention.

FIG. 25 is a layout view showing cell rows according to Embodiment 8 of the present invention where Embodiment 4 and Embodiment 6 are combined. However, the cap cell 55 of Embodiment 6 is used.

As described above, according to Embodiment 8, since Embodiment 4 and Embodiment 6 are combined, the capacitance of the bypass capacitor can further be increased and the effect of attenuating noise can further be enhanced.

Embodiment 9

Figure 26:
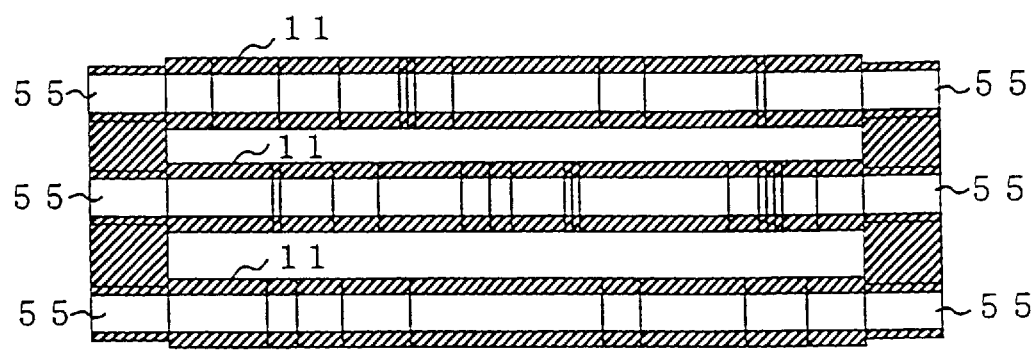
FIG. 26 is a layout view showing cell rows according to Embodiment 9 of the present invention.

FIG. 26 is a layout view showing cell rows according to Embodiment 9 of the present invention where Embodiment 5 and Embodiment 6 are combined. However, the cap cell 55 of Embodiment 6 is used.

As described above, according to Embodiment 9, since Embodiment 5 and Embodiment 6 are combined, the capacitance of the bypass capacitor can further be increased and the effect of attenuating noise can further be enhanced.

Embodiment 10

Figure 27:
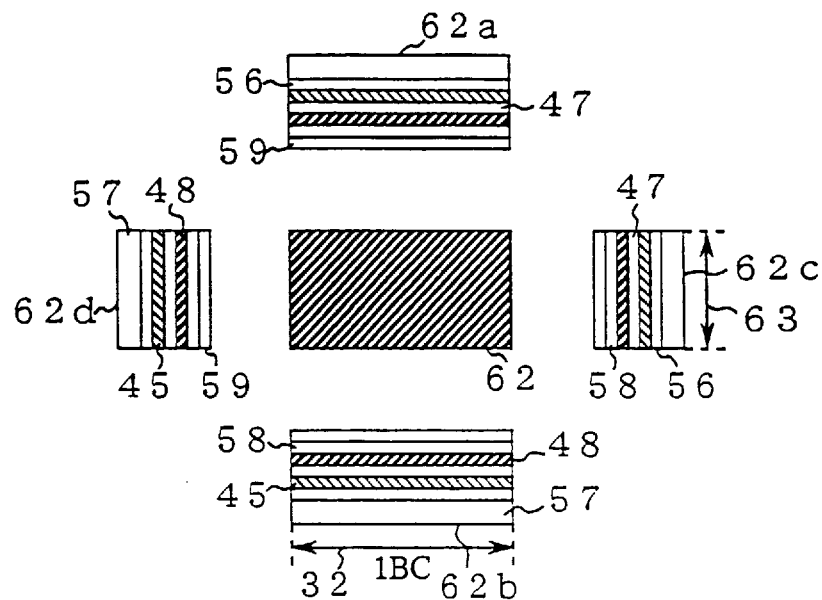
FIG. 27 is a layout view showing a unit capacitor cell according to Embodiment 10 of the present invention.

FIG. 27 is a layout view showing a unit capacitance cell according to Embodiment 10 of the present invention. In FIG. 27, notations 62a through 62d designate an upper sectional view, a lower sectional view, a right sectional view and 2 left sectional view of a unit capacitance cell 62.

The unit capacitance cell 62 has a width of 1BC and a height that is 1/n (n is an arbitrary integer) of a height between the adjacent cell rows 11 and is provided with layers the same as those of the bypass capacitors 60 and 61.

That is, the unit capacity cell 62 is constituted by the silicon substrate 57, the inter-layer film 56, the first electrode 45, the dielectric film 47, the second electrode 48, the first insulating oxide film 58 and the second insulating oxide film 59 which are connected to the respective layers of the feed through cell 44 or the cap cell 55 comprising the same layers.

An explanation will be given of the operation as follows.

Figure 28:
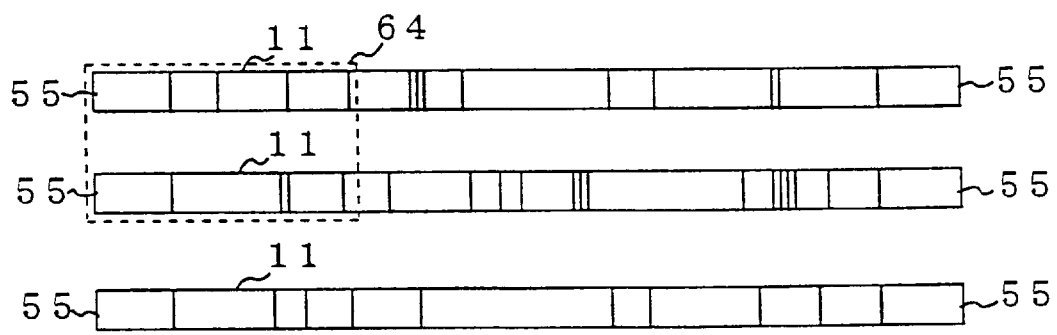
FIG. 28 is a layout view showing a plurality of cell rows.
Figure 29:
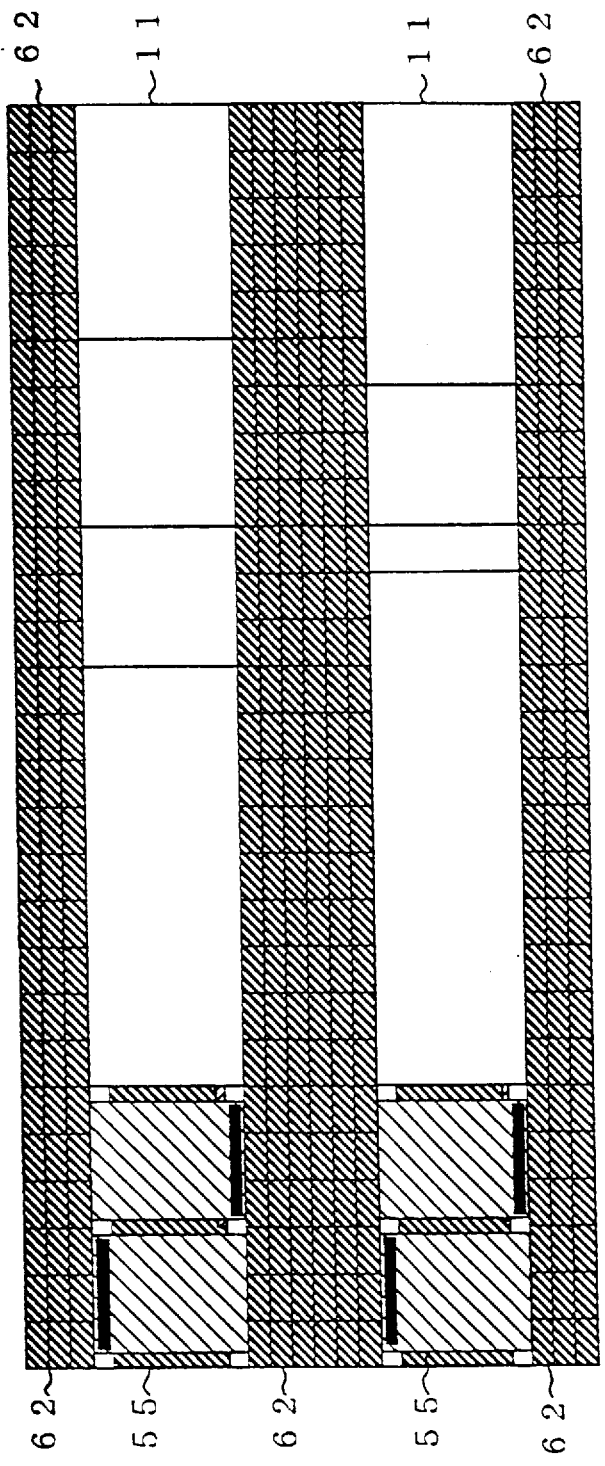
FIG. 29 is a layout view showing cell rows where unit capacitor cells are arranged in a total of wiring channels.

First, as shown by FIG. 27, the unit capacitance cells 62 each have a width of 1BC and a constant height that is 1/n (n is an arbitrary integer) of the height between the adjacent cell rows 11, are prepared. FIG. 29 is a view magnifying a range 64 of a plurality of the arranged cell rows 11 as shown by FIG. 28.

As shown by FIG. 29, as a cap cell, the cap cell 55 shown by Embodiment 2 is used and the unit capacity cells 62 are arranged at all wiring channels. Further, by connecting the respective layers of the cap cells 55 with the corresponding layers of the unit capacitance cells 62, the bypass capacitors can be arranged to expand over the total of the wiring channels.

Incidentally, although the unit capacitance cells 62 are connected to the cap cells 55 in Embodiment 10, the unit capacitance cells 62 may be connected to the feed through cells 44.

As described above, according to Embodiment 10, the unit capacitance cells 62 are arranged over all the wiring channels and therefore, the bypass capacitor can be arranged to expand over all the wiring channels whereby the effect of attenuating noise can further be enhanced. Also, the unit capacitance cells 62 can easily be arranged over all the wiring channels without producing clearances.

Embodiment 11

Figure 30:
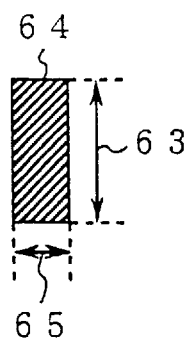
FIG. 30 is a layout view showing a capacitor cell according to Embodiment 11 of the present invention.

FIG. 30 is a layout view showing a capacitance cell according to Embodiment 11 of the present invention. In FIG. 30, a capacitance cell 64 is provided with a constant width and a height which is 1/n (n is an arbitrary integer) of the height between the adjacent cell rows 11 and is provided with layers the same as those of the bypass capacitors 60 and 61.

An explanation will be given of the operation as follows.

First, pins having the respective properties of the first electrode 45, the dielectric film 47, and the second electrode 48 of the capacitance cell 64 having the constant width and the height that is 1/n (n is an arbitrary integer) of the height between the adjacent cell rows 11 as shown by FIG. 30, are prepared.

Figure 31:
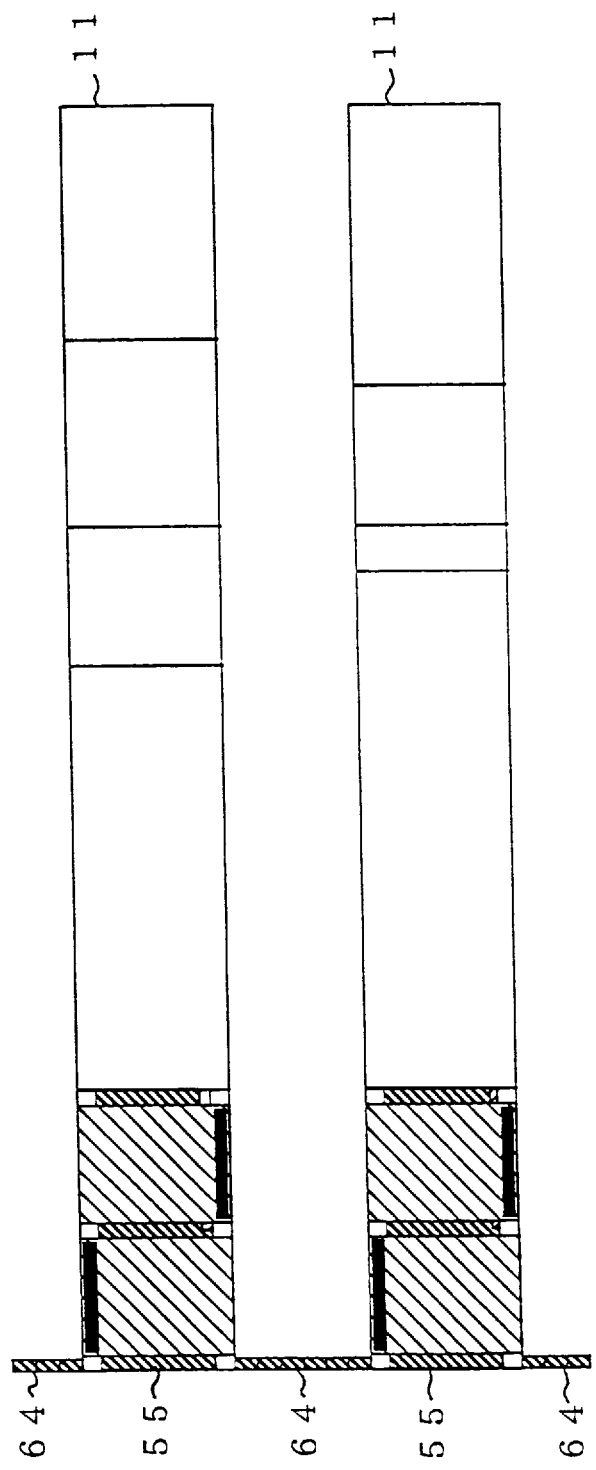
FIG. 31 is a layout view showing an example of arranging capacitor cells.
Figure 32:
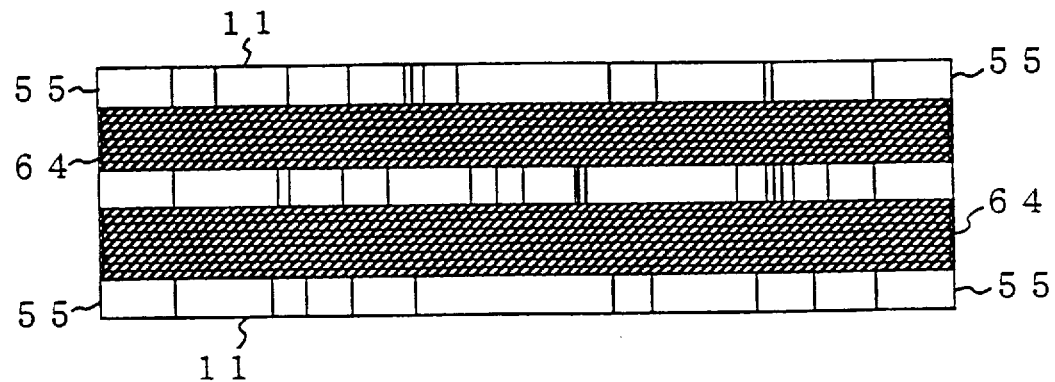
FIG. 32 is a layout view showing cell rows where a capacitor is formed in all of the wiring channels.
Figure 33:
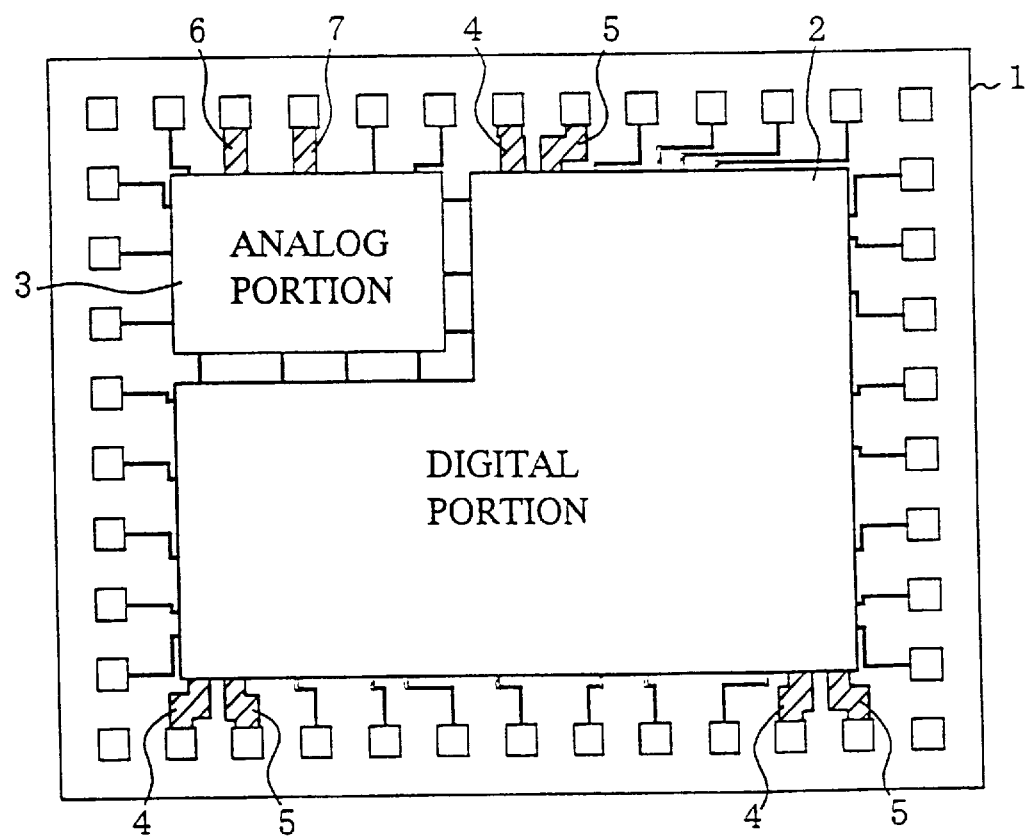
FIG. 33 is a conceptual view showing a layout pattern of a conventional digital/analog mixed IC chip.
Figure 34:
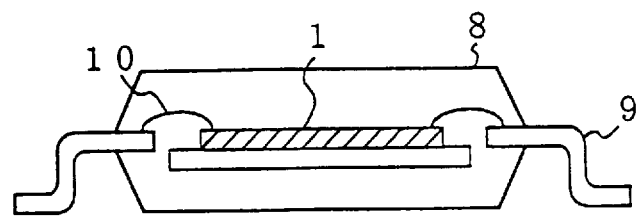
FIG. 34 is a sectional view showing an IC package mounted with a conventional digital/analog mixed IC chip.
Figure 35:
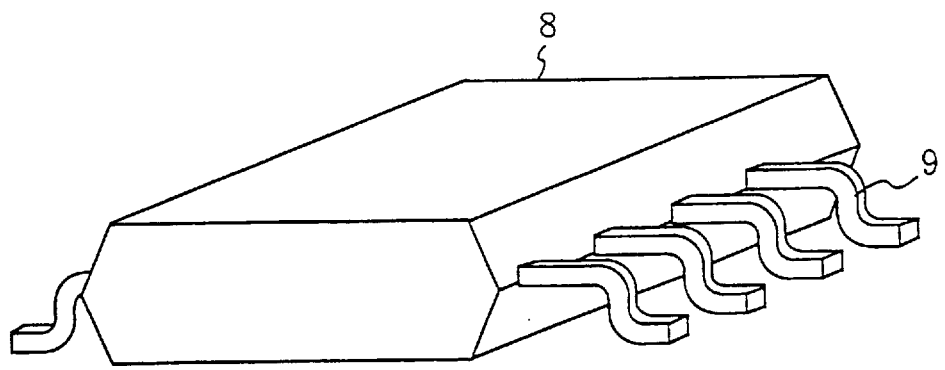
FIG. 35 is a perspective view showing a conventional IC package.

FIG. 31 is a view magnifying the range 64 of the arranged plurality of cell rows 11 as shown by FIG. 28. As cap cells, the cap cells 55 of Embodiment 2 are used and the capacity cells 64 each comprising the pins of the first electrode 45, the dielectric film 47 and the second electrode 48, are arranged at left ends of the wiring channels continuously in one vertical row. The capacitance cells 64 are similarly arranged also at right ends of the wiring channels. Further, after arranging the capacitance cells 64, the respective pins of the first electrodes 45, the dielectric films 47 and the second electrodes 48 are connected to the respectively corresponding layers of the cap cells 55 whereby the capacitance cells 64 are formed over all the wiring channels as shown by FIG. 32.

Incidentally, although the capacitance cells 64 are connected to the cap cells 55 according to Embodiment 11, the capacitance cells 64 may be connected to the feed through cells 44.

As described above, according to Embodiment 11, the capacitance cells 64 each comprising the pins of the first electrode 45, the dielectric film 47 and the second electrode 48 are arranged over the total of the wiring channels and, accordingly, the bypass capacitor can be arranged to expand over the total of the wiring channels whereby the effect of attenuating noise can further be enhanced. Also, by arranging cells using the pins, they can be formed easily.

What is claimed is:

1. A semiconductor integrated circuit having a cell base layout and comprising:
   a silicon substrate;
   a first electrode disposed on the silicon substrate;
   a dielectric film disposed on the first electrode;
   a second electrode disposed on the dielectric film opposite the first electrode and forming a capacitor with the first electrode and the dielectric film:
   a first insulating oxide film disposed on the second electrode;
   grounding wiring connected to one of the first electrode and the second electrode by a first layer wiring; and
   power supply wiring connected the one of the first electrode and the second electrode not connected to the grounding wiring by the first layer wiring, the integrated circuit including cell rows of function cells having respective logical circuits and commonly using the grounding wiring and the power supply wiring, each of the cell rows including feed through cells unifying widths of the respective cell rows.

2. The semiconductor integrated circuit designed by a cell according to claim 1, wherein the capacitor is disposed between cell rows and the first electrode, the dielectric film, and the second electrode are respectively connected to a first electrode, a dielectric film, and a second electrode of the feed through cell.

3. The semiconductor integrated circuit according to claim 2, wherein the capacitor is located at at least one of an upper end and a lower end of each of the cell rows.

4. The semiconductor integrated circuit according to claim 2, wherein the capacitor is located between two of the feed through cells in a column transverse to the cell rows.

5. The semiconductor integrated circuit according to claim 2, wherein the capacitor is located in a column transverse to the cell rows.

6. The semiconductor integrated circuit according to claim 5, wherein the capacitor is a unit capacitance cell in one of the cell rows, each unit capacitance cell having a width of one basic cell and a height of 1/n of an interval between adjacent cell rows.

7. A semiconductor integrated circuit having a cell base layout and comprising:
   a silicon substrate;
   a first electrode disposed on the silicon substrate;
   a dielectric film disposed on the first electrode;
   a second electrode formed on the dielectric film opposite the first electrode and forming a capacitor with the first electrode and the dielectric film;
   a first insulating oxide film disposed on the second electrode;
   grounding wiring connected to one of the first electrode and the second electrode by a first layer wiring; and
   power supply wiring connected the one of the first electrode and the second electrode not connected to the grounding wiring by the first layer wiring, the integrated circuit including cell rows of function cells having respective logical circuits and commonly using the grounding wiring and the power supply wiring, each of the cell rows including cap cells supplying ground and power.

8. The semiconductor integrated circuit according to claim 7, wherein the capacitor is disposed between cell rows and the first electrode, the dielectric film, and the second electrode are respectively connected to a first electrode, a dielectric film, and a second electrode of the cap cell.

9. The semiconductor integrated circuit according to claim 8, wherein the capacitor is located at at least one of an upper end and a lower end of each of the cell rows.

10. The semiconductor integrated circuit according to claim 8, wherein the capacitor is located between two of the cap cells arranged in a column transverse to the cell rows.

11. The semiconductor integrated circuit according to claim 8, wherein the capacitor is located between two of the cell rows in a column transverse to the cell rows.

12. The semiconductor integrated circuit according to claim 11, wherein the capacitor is capacitance cell in one of the cell rows, each unit capacitance cell having a width of one basic cell and a height of 1/n (n is an integer) of an interval between adjacent cell rows.

* * * * *

UNITED STATES PATENT AND TRADEMARK OFFICE
CERTIFICATE OF CORRECTION

PATENT NO. : 5,869,852
DATED : February 9, 1999
INVENTOR(S) : SATORU KINOSHITA It is certified that error appears in the above-identified patent and that said Letters Patent is hereby corrected as shown below:

Title page, and Column 1;

Item [54], the title, should read:

--CELL-BASED SEMICONDUCTOR INTEGRATED CIRCUIT WITH UNIFORM WIDTH CELL ROWS--.

Column 16, line 34, after "1/n" insert --(n is an integer)--.

Signed and Sealed this

Twenty-fourth Day of August, 1999

Attest:

Q. TODD DICKINSON

*Attesting Officer*  *Acting Commissioner of Patents and Trademarks*